(12) United States Patent
Nie

(10) Patent No.: US 11,322,521 B2
(45) Date of Patent: May 3, 2022

(54) ARRAY SUBSTRATE AND MANUFACTURING METHOD THEREOF

(71) Applicant: WUHAN CHINA STAR OPTOELECTRONICS TECHNOLOGY CO., LTD., Hubei (CN)

(72) Inventor: Xiaohui Nie, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 251 days.

(21) Appl. No.: 16/608,097

(22) PCT Filed: May 20, 2019

(86) PCT No.: PCT/CN2019/087552
§ 371 (c)(1),
(2) Date: Oct. 24, 2019

(87) PCT Pub. No.: WO2020/215414
PCT Pub. Date: Oct. 29, 2020

(65) Prior Publication Data
US 2021/0335822 A1    Oct. 28, 2021

(30) Foreign Application Priority Data
Apr. 23, 2019  (CN) .......................... 201910327910.3

(51) Int. Cl.
*H01L 27/14* (2006.01)
*H01L 27/12* (2006.01)

(52) U.S. Cl.
CPC ........ *H01L 27/124* (2013.01); *H01L 27/1262* (2013.01)

(58) Field of Classification Search
CPC .......................... H01L 27/124; H01L 27/1262
USPC ............................................. 257/59, 72, 432
See application file for complete search history.

(56) References Cited

U.S. PATENT DOCUMENTS

| | | | |
|---|---|---|---|
| 6,998,283 B2 * | 2/2006 | Kim .................. | G02F 1/134363 438/30 |
| 2016/0126258 A1 * | 5/2016 | Liu ..................... | H01L 27/1222 257/72 |
| 2018/0061928 A1 | 3/2018 | Takahashi et al. | |

FOREIGN PATENT DOCUMENTS

| | | |
|---|---|---|
| CN | 103474432 A | 12/2013 |
| CN | 108281468 A | 7/2018 |

* cited by examiner

*Primary Examiner* — Tan N Tran

(57) ABSTRACT

Disclosed is an array substrate, including a substrate, and a first data line, a first insulating layer and a second data line, which are disposed on the substrate in sequence. The first insulating layer is provided with a first via hole. The second data line is connected to the first data line through the first via hole. By configuring double-layer data lines, an area of the data lines is increased, thereby reducing the impedance of the data lines, thereby improving the charging capability of the remote pixels and the display quality of the panel.

14 Claims, 4 Drawing Sheets

ARRAY SUBSTRATE AND MANUFACTURING METHOD THEREOF

FIELD OF THE INVENTION

The present invention relates to a display technology field, and more particularly to an array substrate and a manufacturing method thereof.

BACKGROUND OF THE INVENTION

Increasing the resolution and increasing the effective display area are two important topics for the development of display panels having small size and medium size. Increasing the resolution of the display panel by increasing the number of pixels causes the loading of the driving chip to increase and causes the driving capability to decrease. Meanwhile, the length of the data line responsible for writing the pixel signal increases with increase of the number of pixels and the size of the panel. However, the data line is generally made of a metallic material, which causes a significant increase in the metal impedance, resulting in insufficient charging capability of the remote pixel, which in turn causes uneven display of the panel.

SUMMARY OF THE INVENTION

The present invention provides an array substrate to solve the issues of the existing display panel that since the number of pixels is increased to increase the resolution of the panel, the required length of the data line on the array substrate is increased, resulting in the impedance increase of the data line, thereby causing charging capability of the remote pixel and causing a technical problem of display unevenness.

To solve the aforesaid problem, the technical solution provided by the present invention is described as follows:

the present invention provides an array substrate, including a substrate, a first data line disposed on the substrate, a first insulating layer disposed on the first data line and a second data line disposed on the first insulating layer, wherein the first insulating layer is provided with a first via hole; wherein the second data line is connected to the first data line through the first via hole; an orthographic projection of the first data line on the substrate coincides with an orthographic projection of the second data line on the substrate; the array substrate further includes a buffer layer, an active layer, a gate and a second insulating layer.

In one embodiment of the present invention, the active layer is disposed above the first data line, and the gate is disposed above the active layer.

In one embodiment of the present invention, the orthographic projection of the first data line on the substrate covers an orthographic projection of the active layer on the substrate.

In one embodiment of the present invention, the buffer layer is disposed between the first data line and the active layer, and the first insulating layer is disposed between the gate and the active layer, and the second insulating layer is disposed between the second data line and the gate.

In one embodiment of the present invention, the second insulating layer is provided with a second via hole, and the buffer layer is provided with a third via hole.

In one embodiment of the present invention, the third via hole, the second via hole and the first via hole are communicated to one another, and the second data line is connected to the first data line through the third via hole, the second via hole and the first via hole.

The present invention further provides an array substrate, including a substrate, a first data line disposed on the substrate, a first insulating layer disposed on the first data line and a second data line disposed on the first insulating layer, wherein the first insulating layer is provided with a first via hole; wherein the second data line is connected to the first data line through the first via hole.

In one embodiment of the present invention, an orthographic projection of the first data line on the substrate coincides with an orthographic projection of the second data line on the substrate.

In one embodiment of the present invention, the array substrate further includes a buffer layer, an active layer, a gate and a second insulating layer.

In one embodiment of the present invention, the active layer is disposed above the first data line, and the gate is disposed above the active layer.

In one embodiment of the present invention, the orthographic projection of the first data line on the substrate covers an orthographic projection of the active layer on the substrate.

In one embodiment of the present invention, the buffer layer is disposed between the first data line and the active layer, and the first insulating layer is disposed between the gate and the active layer, and the second insulating layer is disposed between the second data line and the gate.

In one embodiment of the present invention, the second insulating layer is provided with a second via hole, and the buffer layer is provided with a third via hole.

In one embodiment of the present invention, the third via hole, the second via hole and the first via hole are communicated to one another, and the second data line is connected to the first data line through the third via hole, the second via hole and the first via hole.

The present invention further provides a manufacturing method of an array substrate, including steps of:

S10, providing a substrate, and forming a first data line on the substrate;

S20, forming a first insulating layer on the substrate, and providing a first via hole in the first insulating layer; and S30, forming a second data line on the first insulating layer, wherein the second data line is connected to the first data line through the first via hole.

In one embodiment of the present invention, an orthographic projection of the first data line on the substrate coincides with an orthographic projection of the second data line on the substrate.

In one embodiment of the present invention, Step S20 includes:

forming a buffer layer above the first data line, and forming a third via hole in the buffer layer;

forming an active layer on the buffer layer;

forming an active layer on the first insulating layer, and forming the first via hole in the first insulating layer;

forming a gate on the first insulating layer; and forming a second insulating layer on the gate, and forming a second via hole in the second insulating layer.

In one embodiment of the present invention, the second data line is electrically connected to the first data line through the second via hole, the first via hole and the third via hole in sequence.

The benefits of the present invention are: by configuring double-layer data lines, the invention increases an area of the data lines, thereby reducing the impedance of the data lines, thereby improving the charging capability of the remote pixels and improving the display quality of the panel.

BRIEF DESCRIPTION OF THE DRAWINGS

In order to more clearly illustrate the embodiments of the present invention and the prior art, the following figures will be described in the embodiments and the prior art are briefly introduced. It is obvious that the drawings are only some embodiments of the present invention, those of ordinary skill in this field can obtain other figures according to these figures without paying the premise.

DETAILED DESCRIPTION OF PREFERRED EMBODIMENTS

Figure 1:
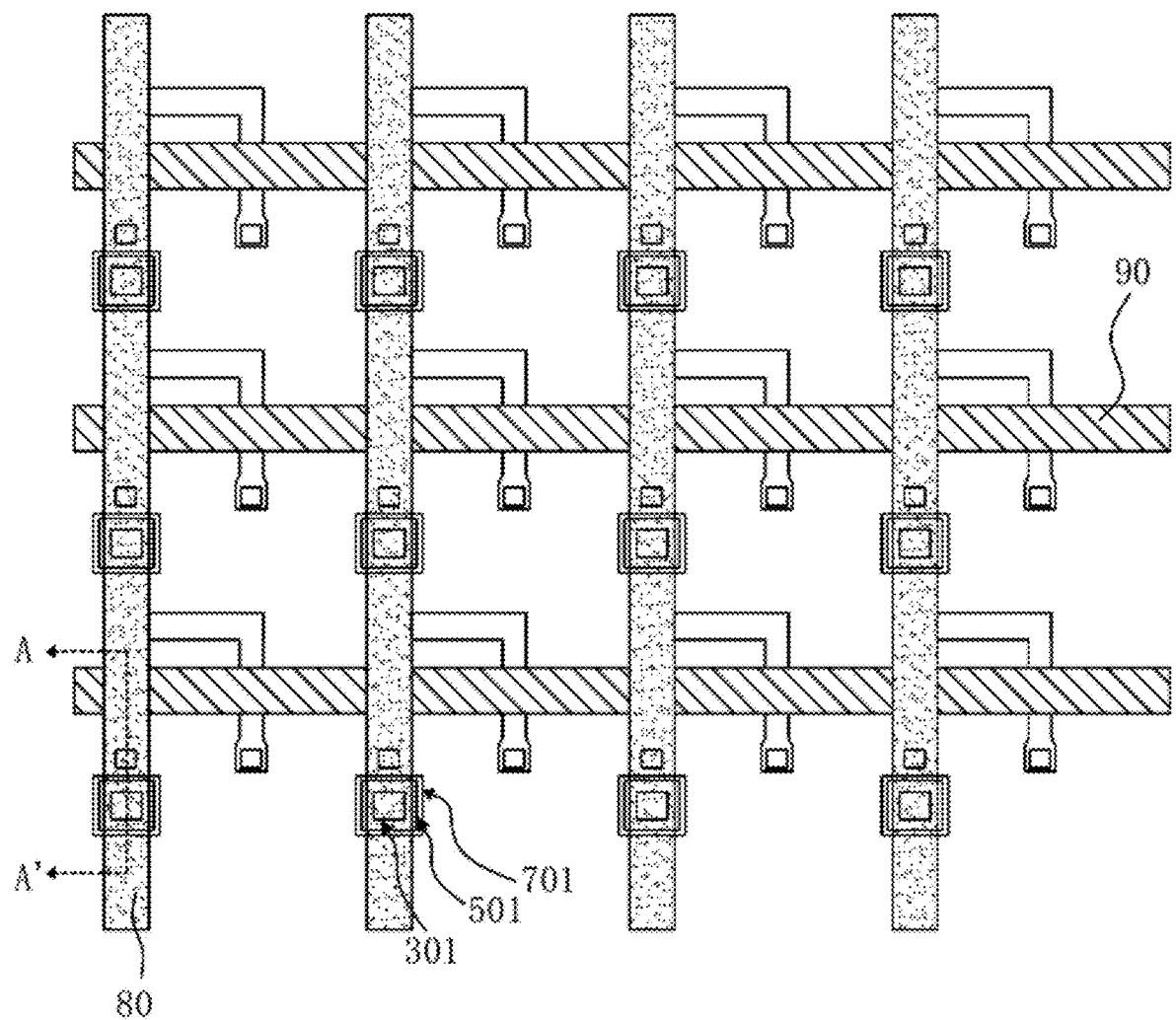
FIG. 1 is a structural diagram of an array substrate of the present invention.

The following descriptions for the respective embodiments are specific embodiments capable of being implemented for illustrations of the present invention with referring to appended figures. The terms of up, down, front, rear, left, right, interior, exterior, side, etcetera are merely directions of referring to appended figures. Thus, the used directional terms are used to describe and understand the present invention, but the present invention is not limited thereto. In the figure, units with similar structures are denoted by the same reference numerals.

As regarding the existing display panel, since the number of pixels is increased to increase the resolution of the panel, the required length of the data line on the array substrate is increased, resulting in the impedance increase of the data line, thereby causing charging capability of the remote pixel, and eventually causing a technical problem of display unevenness. This embodiment can solve the drawback.

The present invention provides an array substrate, including a substrate, a first data line, a first insulating layer and a second data line.

The first data line is disposed on the substrate. The first insulating layer is disposed on the first data line. The second data line is disposed on the first insulating layer.

The first insulating layer is provided with a first via hole. The second data line is electrically connected to the first data line through the first via hole. The data lines are configured in two layers, and the two data lines are connected through the via hole. Compared with design of the single layer data line, the surface area of the data lines can be increased to reduce the impedance of the data lines, thereby improving the charging capability of the pixels and improving the display quality of the panel.

Furthermore, an orthographic projection of the first data line on the substrate coincides with an orthographic projection of the second data line on the substrate. Namely, the second data line and the first data line overlap in a thickness direction of the substrate.

The array substrate further includes an active layer, source/drain, a gate, a scan line and a plurality of inorganic film layers, and a plurality of inorganic film layers may be disposed between the first data line and the second data line.

Besides the first insulating layer disposed between the second data line and the first data line, a plurality of inorganic film layers may also be disposed inbetween. However, it needs to be ensured that the plurality of inorganic film layers is also provided with a via hole, and the via hole can pass through the plurality of inorganic film layers, so that the second data line can be electrically connected to the first data line through this via hole. The inorganic film layer may be a film layer, such as a buffer layer, a gate insulating layer or an interlayer insulating layer.

Figure 3:
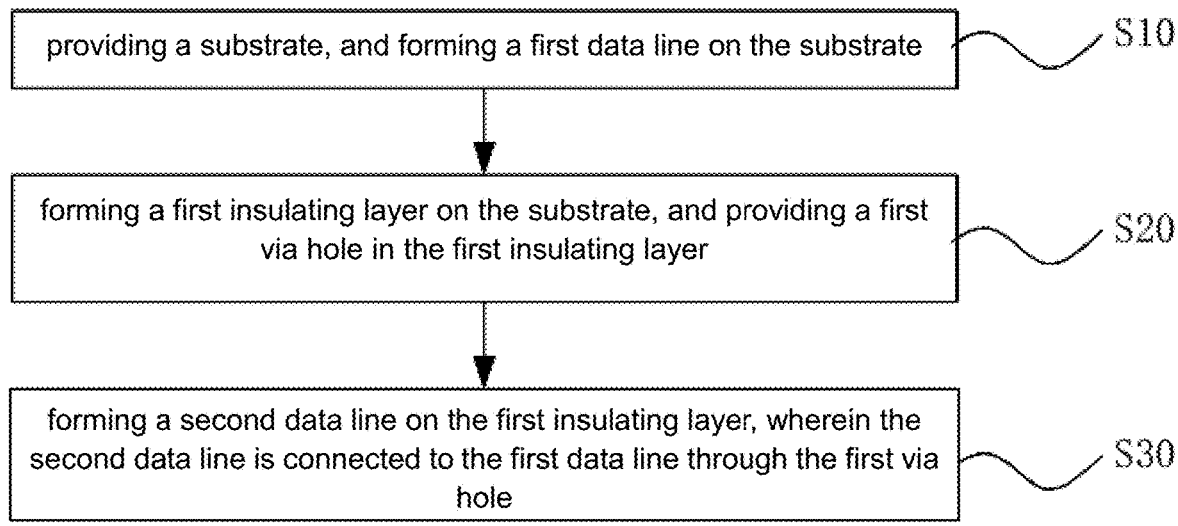
FIG. 3 is a flow chart of steps of a manufacturing method of an array substrate of the present invention.

As shown in FIG. 3, the present invention further provides a manufacturing method of an array substrate, including steps of:

S10, providing a substrate, and forming a first data line on the substrate;

S20, forming a first insulating layer on the substrate, and providing a first via hole in the first insulating layer; and S30, forming a second data line on the first insulating layer, wherein the second data line is connected to the first data line through the first via hole.

An orthographic projection of the first data line on the substrate coincides with an orthographic projection of the second data line on the substrate.

The manufacturing method further includes preparation of an active layer, a gate, source/drain and an inorganic film layer, and a detailed manufacturing method is described in conjunction with specific embodiments.

The array substrate and the manufacturing method thereof according to the present invention will be described in detail below with reference to specific embodiments.

Figure 2:
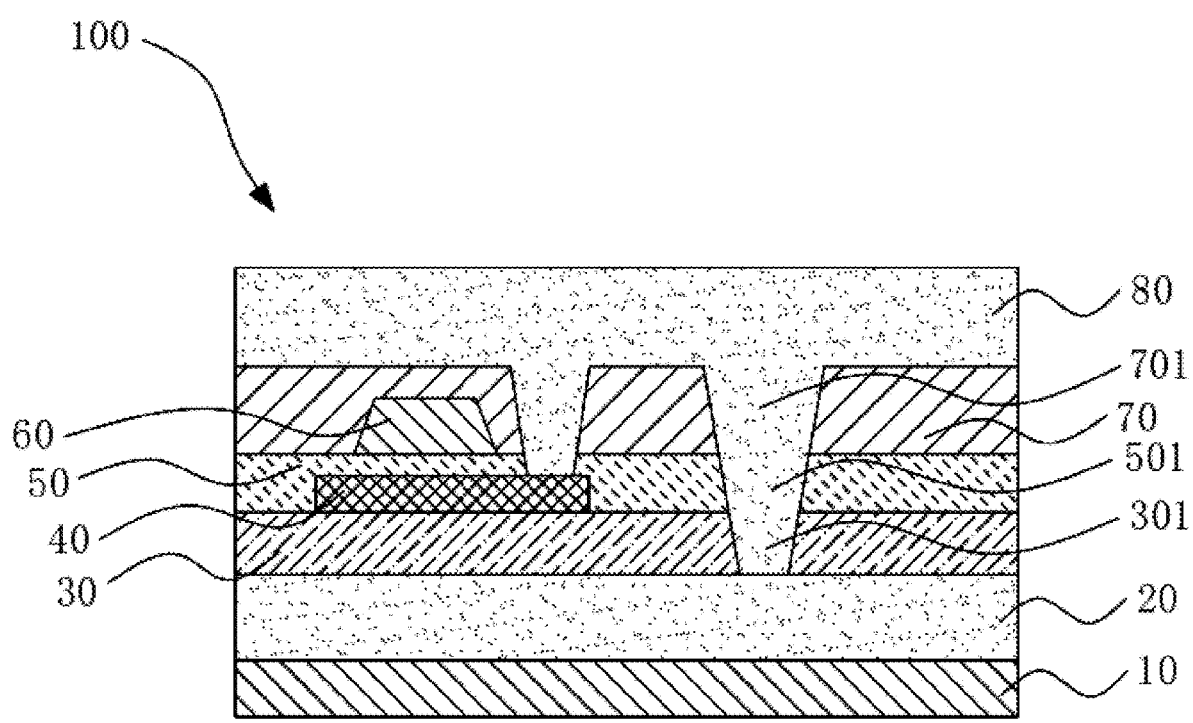
FIG. 2 is a cross-sectional diagram of the A-A' portion of FIG. 1 of the present invention.

As shown in FIG. 1 and FIG. 2, the embodiment provides an array substrate 100 including a substrate 10, a first data line 20, a second data line 80, a buffer layer 30 disposed between the first data line 20 and the second data line 80, an active layer 40, a first insulating layer 50, a gate 60 and a second insulating layer 70.

The first data line 20 is disposed on the substrate 10. The buffer layer 30 is disposed on the first data line 20, and the buffer layer 30 is provided with a third via hole 301.

The active layer 40 is disposed above the first data line 20, and the gate 60 is disposed above the active layer 40.

The gate 60 is a top gate structure. In other embodiments, the gate 60 may also be a bottom gate structure.

The first insulating layer 50 is disposed between the active layer 40 and the gate 60. The first insulating layer 50 is a gate insulating layer, and the first insulating layer 50 is provided with a first via hole 501.

The second insulating layer 70 is disposed between the second data line 80 and the gate 60. The second insulating layer 70 is an interlayer insulating layer, and the second insulating layer is provided with a second via hole 701.

The third via hole 301, the first via hole 501 and the second via hole 701 are communicated to one another to form one via hole together. This one via hole sequentially penetrate through the buffer layer 30, the first insulating layer 50 and the second insulating layer 70, so that the second data line 80 is connected to the first data line 20 through this via hole.

An orthographic projection of the first data line 20 on the substrate 10 covers an orthographic projection of the active layer 40 on the substrate 10. The first data line 20 can function for light blocking to prevent ambient light from entering the inside of the array substrate 100 from the direction of the substrate 10, thereby affecting the current-voltage characteristics of the device.

The array substrate 100 further includes a source, a drain and a scan line 90. The source and the drain may be disposed in the same layer as the second data line 80. The source or drain may be connected to the active layer through the via holes in the second insulating layer and the first insulating layer. The second data line 80 is connected to the source. The scan line 90 can be disposed in the same layer as the gate 60.

A plurality of the scan lines 90 are disposed in parallel along a first direction, and a plurality of the second data lines 80 are disposed in parallel along a second direction, the first direction and the second direction being perpendicular to each other.

The substrate 10 is a flexible substrate or a rigid substrate, such as a polyimide substrate or a glass substrate.

The first data line 20, the second data line 80, the scan line 90 and the gate 60 are all made of metallic materials.

The material of the buffer layer 30, the first insulating layer 50 and the second insulating layer 70 is one of silicon nitride and silicon oxide.

Figure 4:
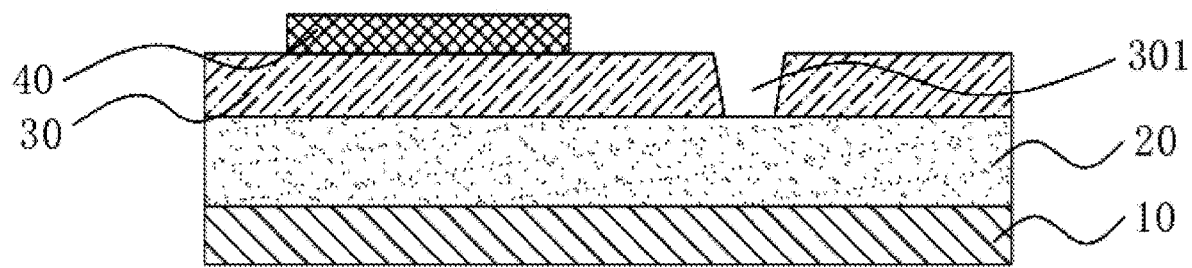
FIG. 4 to FIG. 6 are structural diagrams of a manufacturing process of an array substrate of the present invention.
Figure 5:
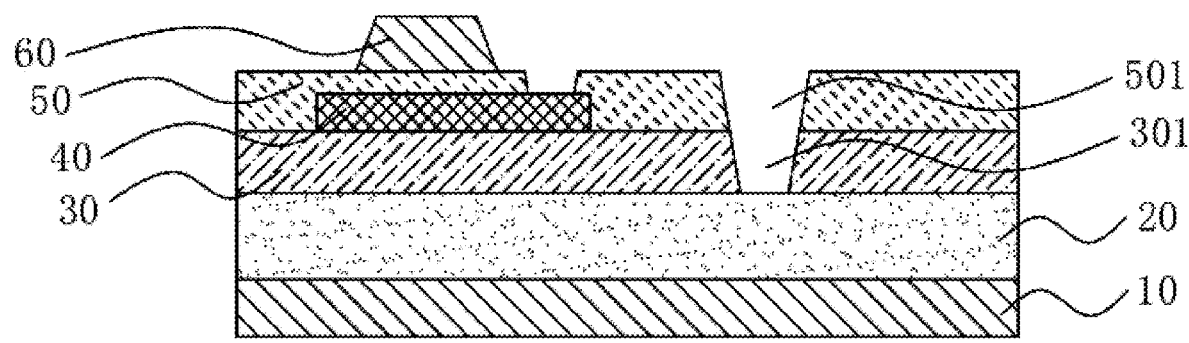
Figure 6:
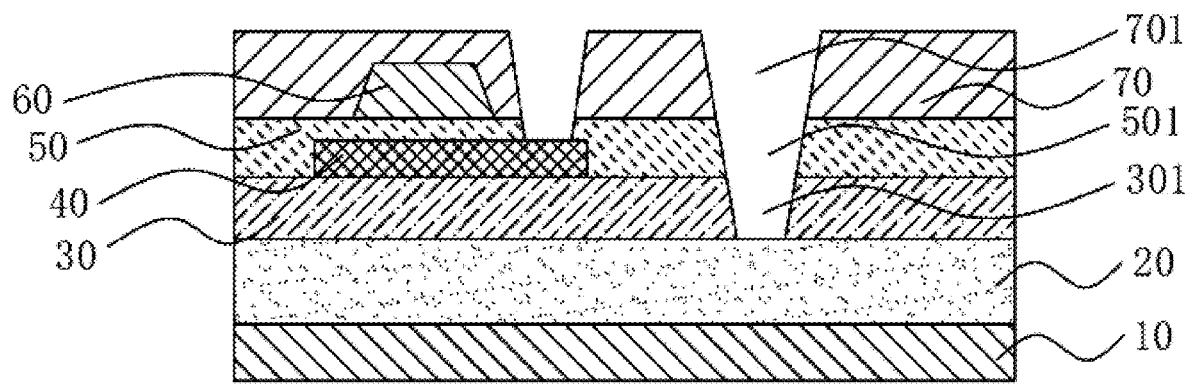

This embodiment further provides a manufacturing method of the aforesaid array substrate 100, including:

S10, providing a substrate 10, and forming a first data line 20 on the substrate 20;

as shown in FIG. 4, a metal layer is deposited on the substrate 10 by physical vapor deposition, and the metal layer is patterned by exposure, development and etching to form the first data line 20, and the substrate 10 is a glass substrate;

S20, forming a first insulating layer 50 on the substrate 10, and providing a first via hole 501 in the first insulating layer 50; and specifically, Step S20 includes:

first, a silicon nitride film layer is formed on the substrate 10 by chemical vapor deposition, the silicon nitride film layer is patterned by exposure, development, etching, etc. to forming a buffer layer 30 on the first data line 20, and a third via hole 301 is formed in the buffer layer 30;

then, a polysilicon layer is formed on the buffer layer 30 by chemical vapor deposition and excimer laser annealing to form a patterned active layer 40 by exposure, development and etching;

as shown in FIG. 5, and then, a silicon oxide film layer is formed on the active layer 40 by chemical vapor deposition, and a patterned first insulating layer 50 is formed by exposure, development and etching, and the first via hole 501 is formed above the third via hole 301, and via holes for connecting the source and the drain are formed over both ends of the active layer 40;

and then, a metal film layer is deposited on the first insulating layer 50 by physical vapor deposition, and the metal film layer is patterned by exposure, development, etching, etc. to form the gate 60 and the scan line;

as shown in FIG. 6, at last, a silicon oxide film layer is deposited on the gate 60 by chemical vapor deposition, and the patterned second insulating layer 70 is formed by exposure, development and etching, and a second via hole 701 is formed over the first via hole 501 of the first insulating layer 50, and via holes connecting the source and the drain are formed above both ends of the active layer 40;

S30, forming a second data line 80 on the first insulating layer 50, wherein the second data line 80 is connected to the first data line 20 through the first via hole 501;

specifically, a metal film layer is deposited on the second insulating layer 70 by physical vapor deposition, and the source and drain are formed while the metal film layer is patterned by exposure, development and etching to form the second data line 80, and the second data line 80 is electrically connected to the first data line 20 through the second via hole 701, the first via hole 501 and the third via hole 301 in sequence, and the source and the drain sequentially penetrate the via holes in the second insulating layer 70 and the first insulating layer 50 to be connected to the active layer.

The benefits are: by configuring double-layer data lines, the invention increases an area of the data lines, thereby reducing the impedance of the data lines, thereby improving the charging capability of the remote pixels and improving the display quality of the panel.

In summary, although the above preferred embodiments of the present invention are disclosed, the foregoing preferred embodiments are not intended to limit the invention, those skilled in the art can make various kinds of alterations and modifications without departing from the spirit and scope of the present invention. Thus, the scope of protection of the present invention is defined by the scope of the claims.

What is claimed is:

1. An array substrate, including:
a substrate;
a first data line extending through a column of pixels, disposed on the substrate;
a first insulating layer, disposed on the first data line, wherein the first insulating layer is provided with a first via hole; and
a second data line extending through the column of the pixels, disposed on the first insulating layer; wherein the second data line is connected to the first data line through the first via hole;
an orthographic projection of the first data line on the substrate coincides with an orthographic projection of the second data line on the substrate;
the array substrate further includes a buffer layer, an active layer, a gate and a second insulating layer,
wherein the active layer is disposed above the first data line, and the orthographic projection of the first data line on the substrate covers an orthographic projection of the active layer on the substrate.

2. The array substrate according to claim 1, wherein the gate is disposed above the active layer.

3. The array substrate according to claim 2, wherein the buffer layer is disposed between the first data line and the active layer, and the first insulating layer is disposed between the gate and the active layer, and the second insulating layer is disposed between the second data line and the gate.

4. The array substrate according to claim 2, wherein the second insulating layer is provided with a second via hole, and the buffer layer is provided with a third via hole.

5. The array substrate according to claim 4, wherein the third via hole, the second via hole and the first via hole are communicated to one another, and the second data line is connected to the first data line through the third via hole, the second via hole and the first via hole.

6. An array substrate, including:
a substrate;
a first data line extending through a column of pixels, disposed on the substrate;
a first insulating layer, disposed on the first data line, wherein the first insulating layer is provided with a first via hole; and
a second data line extending through the column of the pixels, disposed on the first insulating layer; wherein the second data line is connected to the first data line through the first via hole,
wherein the array substrate further includes an active layer, the active layer is disposed above the first data line and an orthographic projection of the first data line on the substrate coincides with an orthographic projection of the second data line on the substrate.

7. The array substrate according to claim 6, wherein the array substrate further includes a buffer layer, a gate and a second insulating layer.

8. The array substrate according to claim 7, where the gate is disposed above the active layer.

9. The array substrate according to claim 8, wherein the buffer layer is disposed between the first data line and the active layer, and the first insulating layer is disposed between the gate and the active layer, and the second insulating layer is disposed between the second data line and the gate.

10. The array substrate according to claim 8, wherein the second insulating layer is provided with a second via hole, and the buffer layer is provided with a third via hole.

11. The array substrate according to claim 10, wherein the third via hole, the second via hole and the first via hole are communicated to one another, and the second data line is connected to the first data line through the third via hole, the second via hole and the first via hole.

12. A manufacturing method of an array substrate, including steps of:
   providing a substrate, and forming a first data line extending through a column of pixels on the substrate;
   forming a first insulating layer on the substrate, and providing a first via hole in the first insulating layer; and
   forming a second data line extending through the column of the pixels on the first insulating layer, wherein the second data line is connected to the first data line through the first via hole,
   wherein the array substrate further includes an active layer, the active layer is formed above the first data line and an orthographic projection of the first data line on the substrate coincides with an orthographic projection of the second data line on the substrate.

13. The manufacturing method of the array substrate according to claim 12, wherein the step of forming the first insulating layer on the substrate, and providing the first via hole in the first insulating layer includes:
   forming a buffer layer above the first data line, and forming a third via hole in the buffer layer;
   forming the active layer on the buffer layer;
   forming the first insulating layer on the active layer, and forming the first via hole in the first insulating layer;
   forming a gate on the first insulating layer; and
   forming a second insulating layer on the gate, and forming a second via hole in the second insulating layer.

14. The manufacturing method of the array substrate according to claim 13, wherein the second data line is electrically connected to the first data line through the second via hole, the first via hole and the third via hole in sequence.

* * * * *